(12) United States Patent
Kim et al.

(10) Patent No.: US 11,756,895 B2
(45) Date of Patent: Sep. 12, 2023

(54) ELECTRONIC APPARATUS AND METHOD OF MANUFACTURING THE SAME

(71) Applicant: SAMSUNG DISPLAY CO., LTD., Yongin-si (KR)

(72) Inventors: Dong Hwan Kim, Seongnam-si (KR); Hee Chang Park, Suwon-si (KR); Jeong Jin Kim, Cheonan-si (KR); Jinkyu Kim, Cheongju-si (KR); Moo-Hyun Jo, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 145 days.

(21) Appl. No.: 16/943,035

(22) Filed: Jul. 30, 2020

(65) Prior Publication Data

US 2021/0057351 A1 Feb. 25, 2021

(30) Foreign Application Priority Data

Aug. 20, 2019 (KR) .................. 10-2019-0101861

(51) Int. Cl.
*H01L 23/552* (2006.01)
*H01L 23/544* (2006.01)

(52) U.S. Cl.
CPC .......... *H01L 23/552* (2013.01); *H01L 23/544* (2013.01); *H01L 2223/54433* (2013.01)

(58) Field of Classification Search
CPC .... H01L 23/552; H01L 23/053; H05K 9/0024
See application file for complete search history.

(56) References Cited

U.S. PATENT DOCUMENTS

| | | | | |
|---|---|---|---|---|
| 5,627,364 A | * | 5/1997 | Codama | H01L 25/167 250/208.1 |
| 2010/0061577 A1 | * | 3/2010 | Yeates | H04R 17/00 381/337 |
| 2019/0121407 A1 | * | 4/2019 | Lee | H01L 23/44 |
| 2019/0157612 A1 | | 5/2019 | Yoo et al. | |
| 2020/0388576 A1 | * | 12/2020 | Gaines | B23K 26/362 |

FOREIGN PATENT DOCUMENTS

| | | | | |
|---|---|---|---|---|
| CN | 1135702 A | * | 11/1996 | ............... A44C 5/14 |
| KR | 10-2016-0096927 | | 8/2016 | |
| WO | WO-2013021906 A1 | * | 2/2013 | ............ H04R 17/00 |

* cited by examiner

*Primary Examiner* — Michele Fan
(74) *Attorney, Agent, or Firm* — F. Chau & Associates, LLC

(57) ABSTRACT

An electronic apparatus includes: a circuit board; a driving chip mounted on the circuit board; a shield-can including a top surface and a side surface extending in a direction from the top surface to the circuit board, wherein the top surface covers the driving chip; and a first film disposed on the shield-can and including a first opening that exposes a part of the top surface of the shield-can.

8 Claims, 11 Drawing Sheets

ELECTRONIC APPARATUS AND METHOD OF MANUFACTURING THE SAME

CROSS-REFERENCE TO RELATED APPLICATION

This application claims priority under 35 USC § 119 to Korean Patent Application No. 10-2019-0101861 filed on Aug. 20, 2019 in the Korean Intellectual Property Office (KIPO), the disclosure of which is incorporated by reference herein in its entirety.

TECHNICAL FIELD

Exemplary embodiments of the present inventive concept relate generally to an electronic apparatus and a method of manufacturing the electronic apparatus. More particularly, exemplary embodiments of the present inventive concept relate to an electronic apparatus including a shield-can and a method of manufacturing the electronic apparatus.

DISCUSSION OF THE RELATED ART

Electronic apparatuses, such as a mobile phone, a digital camera, and a laptop computer, include a circuit board and are desired to be manufactured in a relatively small size with a high performance. As a result, a large number of complex electronic component elements may be mounted in a compact space. In other words, a printed circuit board (e.g., a flexible circuit board) may be used to mount a complex mechanism and a circuit in a narrow space of the electronic apparatus.

When the electronic apparatus or communication apparatus is used, electromagnetic waves are generated from various components mounted to the printed circuit board. Since the electromagnetic waves may act as noise against a communication function of the electronic apparatus, a shield-can, which is formed of metal and configured to block the electromagnetic waves, may cover the component when the component is mounted on the printed circuit board.

SUMMARY

According to an exemplary embodiment of the present inventive concept, an electronic apparatus includes: a circuit board; a driving chip mounted on the circuit board; a shield-can including a top surface and a side surface extending in a direction from the top surface to the circuit board, wherein the top surface covers the driving chip; and a first film disposed on the shield-can and including a first opening that exposes a part of the top surface of the shield-can.

In an exemplary embodiment of the present inventive concept, the first film includes a body and a handle extending from the body, wherein the body of the first film covers the shield-can.

In an exemplary embodiment of the present inventive concept, at least one corner of the body of the first film is chamfered.

In an exemplary embodiment of the present inventive concept, a corner of the top surface of the shield-can is exposed by the chamfered corner of the first film.

In an exemplary embodiment of the present inventive concept, an edge of the first film protrudes beyond the side surface of the shield-can.

In an exemplary embodiment of the present inventive concept, an identification mark is formed on the part of the top surface of the shield-can exposed by the opening of the first film.

In an exemplary embodiment of the present inventive concept, the first film is transparent.

In an exemplary embodiment of the present inventive concept, the first film includes a second opening at a side surface of a body of the first film.

In an exemplary embodiment of the present inventive concept, the first film includes an adhesive layer and a film layer disposed on the adhesive layer, wherein the adhesive layer is bonded to the shield-can.

In an exemplary embodiment of the present inventive concept, the electronic apparatus further including: a second film attached onto the first film.

According to an exemplary embodiment of the present inventive concept, a method of manufacturing an electronic apparatus includes: mounting a driving chip on a circuit board; disposing a shield-can on the circuit board, wherein the shield-can includes a top surface and a side surface extending in a direction from the top surface to the circuit board, wherein the top surface covers the driving chip; attaching a first film to the top surface of the shield-can, wherein the first film includes a first opening that exposes a part of the top surface of the shield-can; attaching a second film onto the shield-can; removing the second film; and forming a first identification mark on the part of the top surface of the shield-can exposed by the first opening of the first film.

In an exemplary embodiment of the present inventive concept, the method further includes: forming a second identification mark on the second film, wherein the first identification mark of the shield-can is formed using the second identification mark.

In an exemplary embodiment of the present inventive concept, the first film includes a first adhesive layer and a first film layer disposed on the first adhesive layer, wherein the first adhesive layer is bonded to the shield-can, and wherein the second film includes a second adhesive layer and a second film layer disposed on the second adhesive layer, wherein the second adhesive layer is bonded to the first film layer.

In an exemplary embodiment of the present inventive concept, the second film further includes a filler layer disposed in an area corresponding to the opening of the first film and disposed under the second film layer.

In an exemplary embodiment of the present inventive concept, a filler layer opening is formed in a portion of the second adhesive layer where the filler layer is disposed, wherein the filler layer is disposed in the filler layer opening, and wherein the filler layer has a thickness greater than a thickness of the second adhesive layer.

In an exemplary embodiment of the present inventive concept, at least one corner of the body of the first film is chamfered so that a corner of the top surface of the shield-can is exposed, and wherein the second film covers at least a part of the corner of the top surface of the shield-can exposed by the first film.

In an exemplary embodiment of the present inventive concept, the second film includes a body and a handle that extends from the body, wherein the body of the second film overlaps the first film, and wherein the handle extends beyond the corner of the top surface of the shield-can that is not covered by the first film.

In an exemplary embodiment of the present inventive concept, the method further includes: performing a process of assembling the electronic apparatus in a state where the second film is attached onto the shield-can.

In an exemplary embodiment of the present inventive concept, the identification mark is formed through a laser marking on a portion of the part of the shield-can exposed by the opening of the first film.

In an exemplary embodiment of the present inventive concept, the first film includes a second opening at a side surface of a body of the first film, and wherein a part of the second film is directly attached onto the top surface of the shield-can and is disposed in the first opening and the second opening of the first film.

BRIEF DESCRIPTION OF THE DRAWINGS

The above and other features of the present inventive concept will become more apparent by describing in detailed exemplary embodiments thereof with reference to the accompanying drawings, in which.

DETAILED DESCRIPTION OF THE EMBODIMENTS

Hereinafter, exemplary embodiments of the present inventive concept will be explained in detail with reference to the accompanying drawings.

Figure 1:
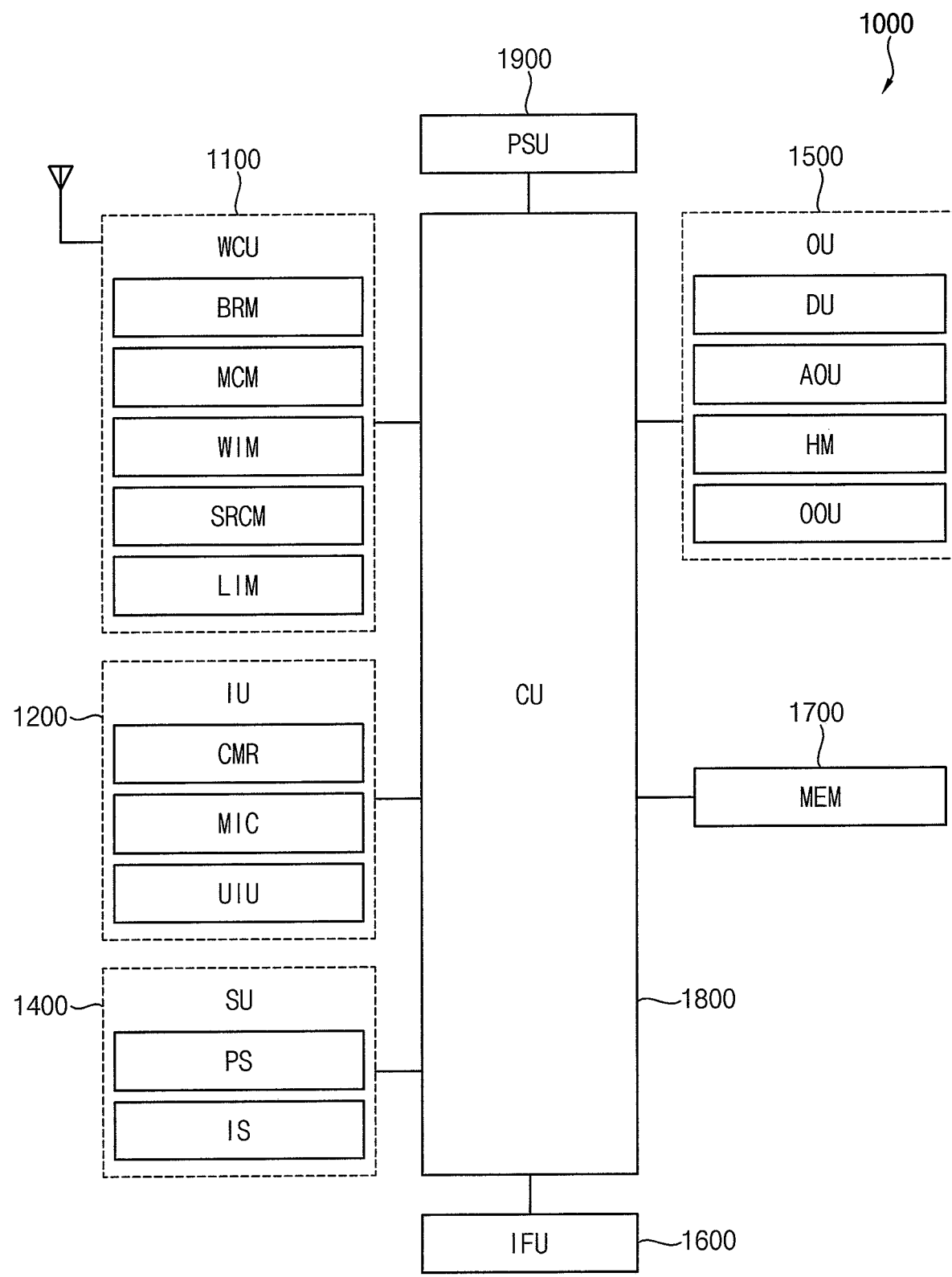
FIG. 1 is a block diagram of an electronic apparatus according to exemplary embodiment of the present inventive concept.

FIG. 1 is a block diagram of an electronic apparatus according to an exemplary embodiment of the present inventive concept. The electronic apparatus may be implemented as a mobile terminal 1000.

The mobile terminal 1000 may include, for example, a mobile phone, a smart phone, a laptop computer, a digital broadcasting terminal, a personal digital assistant (PDA), a portable multimedia player (PMP), a navigation, a slate PC, a tablet PC, an ultrabook, a wearable apparatus (such as a smart watch, a smart glass, and a head mounted display (HMD)), and the like.

However, it may be easily known by those skilled in the art that the configuration according to this embodiment described herein may also be applied to a fixed terminal such as a digital TV, a desktop computer, and a digital signage, except for the case applicable only to a mobile terminal.

The mobile terminal 1000 may include a wireless communication unit 1100 (e.g., a wireless communication circuit), an input unit 1200 (e.g., an input circuit), a sensing unit 1400 (e.g., a sensing circuit), an output unit 1500 (e.g., an output circuit), an interface unit (e.g., an interface circuit) 1600, a memory 1700, a control unit 1800 (e.g., a control circuit), a power supply unit 1900, and the like. However, the present inventive concept is not limited thereto. For example, the mobile terminal 1000 may include additional components and/or may not include some components listed above.

For example, the wireless communication unit 1100 may include at least one module or circuit that enables wireless communication between the mobile terminal 1000 and a wireless communication system, between the mobile terminal 1000 and another mobile terminal, and/or between the mobile terminal 1000 and an external server. In addition, the wireless communication unit 1100 may include at least one module or circuit that connects the mobile terminal 1000 to at least one network.

The wireless communication unit 1100 may include at least one of a broadcast receiving circuit, a mobile communication circuit, a wireless Internet circuit, a short-range communication circuit, and a location information circuit.

The input unit 1200 may include a camera or an image input unit configured to receive an image signal. The input unit 1200 may further include a microphone or audio input unit configured to receive an audio signal, and a user input unit configured to receive information from a user (such as a touch key and a push key (e.g., mechanical key)). The voice data or image data collected by the input unit 120 may be analyzed and processed as a control command of the user.

The sensing unit 1400 may include at least one sensor configured to sense at least one of conditions in the mobile terminal 1000, peripheral environment conditions in the proximity of the mobile terminal 1000, and user information. For example, the sensing unit 1400 may include a proximity sensor, an illumination sensor, a touch sensor, and the like.

The output unit 1500 may generate an output related to visual, auditory, or tactile sense data or the like, and may include at least one of a display unit, an audio output unit, a haptic module, and/or an optical output unit. The display unit may be mutually layer-structured or integrally formed with a touch sensor to implement a touch screen. The touch screen may function as the user input unit that provides an input interface between the mobile terminal 1000 and the user, and may provide an output interface between the mobile terminal 1000 and the user.

The interface unit 1600 may serve as a channel with respect to various kinds of external devices connected to the mobile terminal 1000. The mobile terminal 1000 may perform a control related to the connected external device in response to the external device being connected to the interface unit 1600.

In addition, the memory 1700 may store data that supports various functions of the mobile terminal 1000. The memory 1700 may store a plurality of application programs (or applications) executed in the mobile terminal 1000, and data and instructions for operations of the mobile terminal 1000. In addition, the application program may be stored in the memory 170, installed in the mobile terminal 1000, and driven to perform the operations (or, e.g., functions) of the mobile terminal 1000 by the control unit 1800.

For example, the control unit 1800 may control overall operations of the mobile terminal 1000 in addition to the operations related to the application programs. The control unit 1800 may process signals, data, information, and the like inputted or outputted through the above-described components or drive the application program stored in the memory 1700, so that information or functions suitable for the user may be provided or processed.

In addition, the control unit 1800 may control at least some of the components of the mobile terminal 1000 to drive an application program stored in the memory 1700.

The power supply unit 1900 may receive external power and/or internal power and supply the power to the components included in the mobile terminal 1000, under the control of the control unit 1800. The above power supply unit 1900 may include, for example, a battery, and the battery may be an embedded battery or a replaceable battery.

Figure 2:
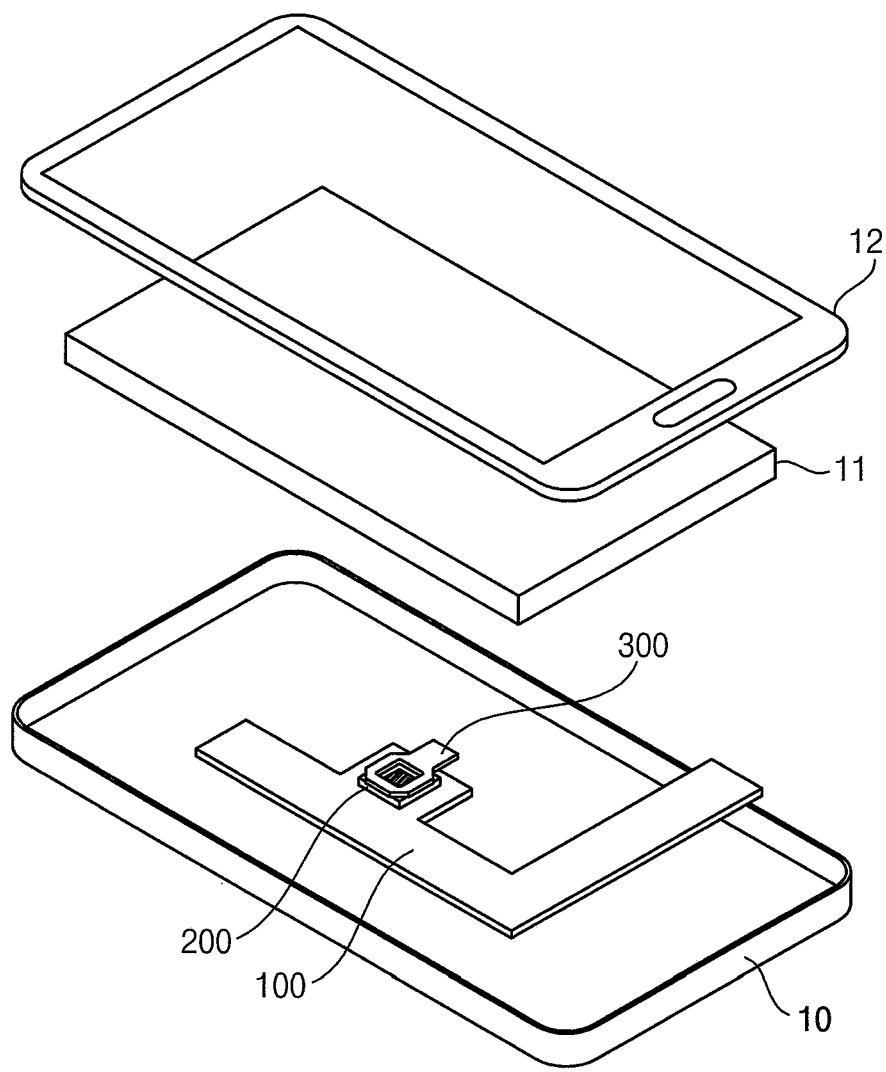
FIG. 2 is a schematic exploded perspective diagram illustrating the electronic apparatus of FIG. 1.

FIG. 2 is a schematic exploded perspective diagram illustrating the electronic apparatus of FIG. 1.

Referring to FIG. 2, the electronic apparatus may include a lower case 10, a display module 11, an upper case 12, a circuit board 100, a driving chip (see 110 in FIG. 3), a shield-can 200, and a first film 300.

The lower case 10 and the upper case 12 may accommodate the display module 11 and the circuit board 100.

The circuit board 100 may be mounted on the display module 11 with electronic components to implement various functions of the electronic apparatus. The electronic components may control operations of the display module 11, may process external inputs received from a touch sensor, may control operations of the user input unit and various sensors, and may control a function of each component, such as a camera, speaker, and receiver, of the mobile terminal.

Various driving chips may be mounted for each function. For example, an application processor (AP), which is a non-memory semiconductor used in a digital TV as well as a terminal. In addition, the application processor may serve as a central processing unit (CPU) of a typical computer. The application processor, which may be mounted on the mobile terminal, may be a system-on-chip formed by integrating functions for controlling various system apparatuses/interfaces into one chip to drive the operating system (OS) of the electronic apparatus and applications used for operating the electronic apparatus.

A shield-can 200 may be used to protect the driving chip mounted on a surface of the circuit board 100 and mount another component after laminating the shield-can 200 on the circuit board 100. The shield-can 200 may be formed of metal and may have a polygonal shape including a top surface covering a top surface of each driving chip and a wall surface positioned between the top surface and the circuit board 100. For example, the wall surface may be connected to the top surface of the shield-can 200.

Figure 3:
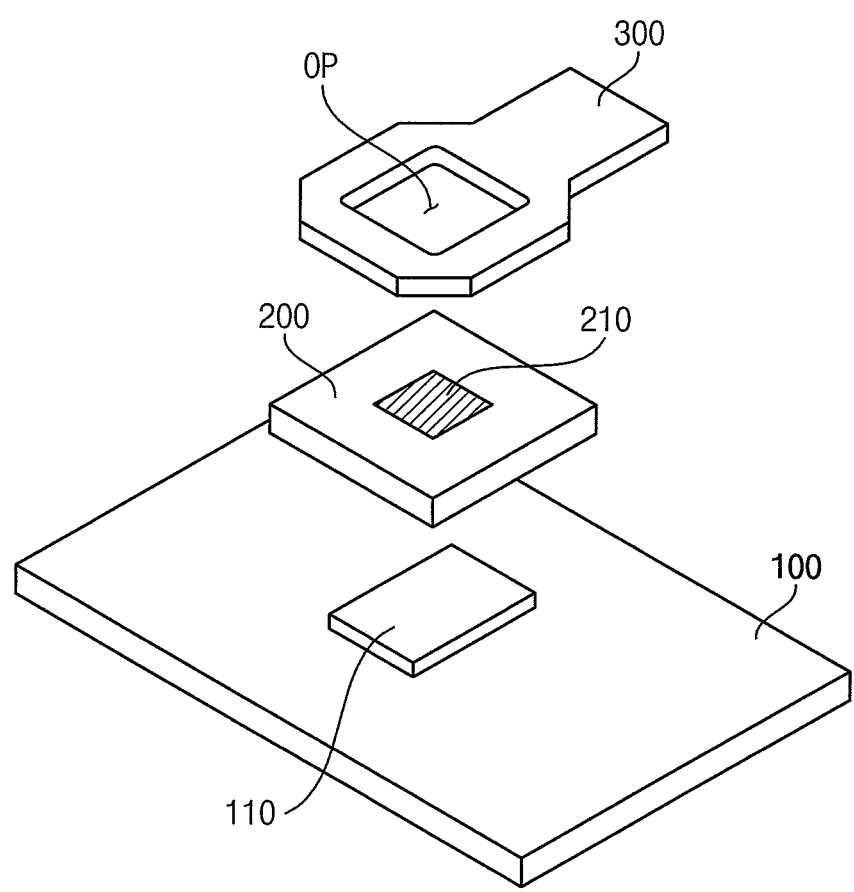
FIG. 3 is a partially enlarged exploded perspective diagram illustrating a shield-can of the electronic apparatus of FIG. 2.
Figure 4:
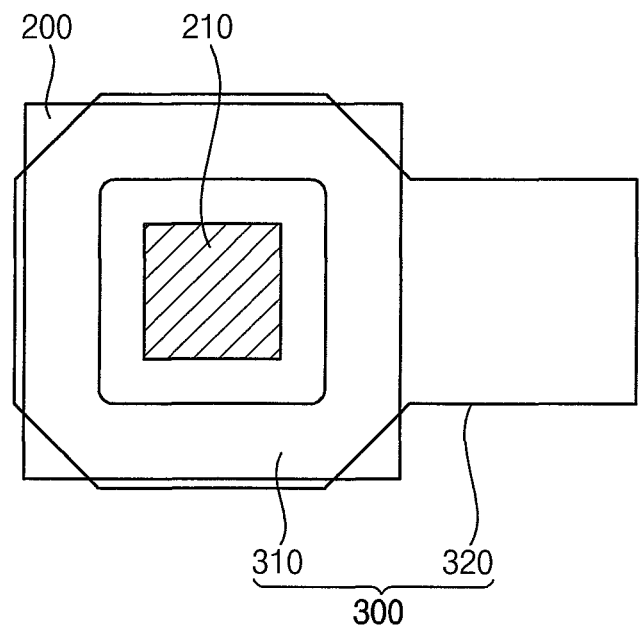
FIG. 4 is a plan view illustrating a shield-can and a first film in FIG. 3.
Figure 5:
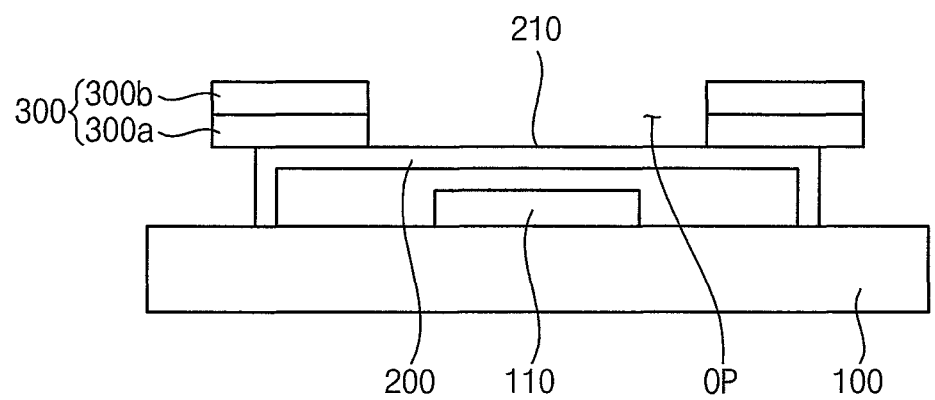
FIG. 5 is a cross-sectional view illustrating a shield-can in FIG. 3.

FIG. 3 is a partially enlarged exploded perspective diagram illustrating a shield-can of the electronic apparatus of FIG. 2. FIG. 4 is a plan view illustrating a shield-can and a first film in FIG. 3, and FIG. 5 is a cross-sectional view illustrating a shield-can in FIG. 3.

Referring to FIGS. 2 to 5, the driving chip 110 may be mounted on the circuit board 100. The shield-can 200 may be disposed on the circuit board 100 to cover the driving chip 110.

The shield-can 200 may include a top surface disposed parallel to the circuit board 100 and a wall surface vertically extending from the top surface. For example, the top surface of the shield-can 200 may have a rectangular shape and may be flat.

A first film 300 may be disposed on the shield-can 200. For example, the first film 300 may be attached onto the top surface of the shield-can 200. The first film 300 may prevent the shield-can 200 from being damaged in the process of manufacturing the electronic apparatus.

The first film 300 may include an adhesive layer 300*a* and a film layer 300*b*. The adhesive layer 300*a* may be bonded to the shield-can 200, and may include, for example, a pressure sensitive adhesive.

The film layer 300*b* may be disposed on the adhesive layer 300*a*. The adhesive layer 300*a* and the film layer 300*b* may have substantially the same shape viewed in a plan view. The film layer 300*b* may include, for example, a transparent polymer resin such as polyethylene terephthalate (PET).

The first film 300 may be transparent. Accordingly, an operator may easily check a position and a state of the shield-can 200 disposed below the first film 300.

The first film 300 may include a body 310 and a handle 320. The body 310 may cover the shield-can 200. For example, the body 310 may cover the top surface of the shield-can 200. An opening OP may be formed in the body 310 to expose a part of the shield-can 200. For example, the opening OP may expose the top surface of the shield-can 200. An identification mark 210 may be formed on the exposed part of the top surface of the shield-can 200. The identification mark 210 may include code and another display of information for inputting module material and process history information that is to be displayed. For example, the identification mark 210 may be formed by laser-marking the identification mark 210 on the top surface of the shield-can 200. In addition, the identification mark 210 may be formed through a sticker attachment, a printing, or the like.

The handle 320 of the first film 300 may extend from one side of the body 310 of the first film 300 and may extend to the outside of the shield-can 200 when viewed in a plan view. For example, the handle 320 may extend beyond an edge of the shield-can 200.

The body 310 of the first film 300 may have a polygonal shape and may cover the top surface of the shield-can 200. For example, the body 310 may have a hexagonal shape or rectangular shape. For example, each corner of the rectangular shape of the body 310 may have a chamfered shape. Accordingly, the four corners of the top surface of the shield-can 200 may be exposed without being covered by the first film 300. In addition, the remaining portion of the shield-can 200 except for the corners of the top surface and the identification mark 210 may be covered by the first film 300. For example, an edge of the first film 300 may be formed to the outside of an edge of the top surface of the shield-can 200. For example, in one sectional view (FIG. 5), the first film 300 may be attached onto the top surface of the shield-can 200 such that the edge of the first film 300 protrudes beyond the edge of the shield-can 200.

In an electronic apparatus according to a comparative example, a protective film for protecting the shield-can may be removed during manufacturing process, and then the identification mark may be formed on the top surface of the shield-can. In this case, a defect such as a dent may occur on the top surface of the shield-can in a subsequent assembly process after the protective film is removed. Further, it is not easy to rework the above shield-can.

In the electronic apparatus according to an exemplary embodiment of the present inventive concept, since the first film 300 including the body 310, which includes opening OP, and the handle 320 is attached onto the top surface of the shield-can 200, the defect such as the dent occurring on the top surface of the shield-can may be reduced or prevented in the subsequent assembling process. In addition, the opening OP that exposes the identification mark 210 may be formed in the first film 300, so that the defect may be prevented without changing the method of manufacturing the electronic apparatus.

In addition, each of the corners of the rectangular shape of the body 310 of the first film 300 may have the chamfered shape, and thus the four corners of the shield-can 200 may be exposed, so that the exposed corners may be used as alignment marks in the process of inspecting an installed position of the shield-can 200 after assembly, or in the process of forming the identification mark 210 on the top surface of the shield-can 200.

In an exemplary embodiment of the present inventive concept, the body 310 may have hexagonal shape so that the four corners of the shield-can 200 may be exposed.

FIGS. 6A and 6B, FIGS. 7A and 7B, FIGS. 8A and 8B, and FIGS. 9A and 9B are plan views and cross-sectional views illustrating a shield-can for explaining a method of manufacturing an electronic apparatus according to an exemplary embodiment of the present inventive concept.

Figure 6A:
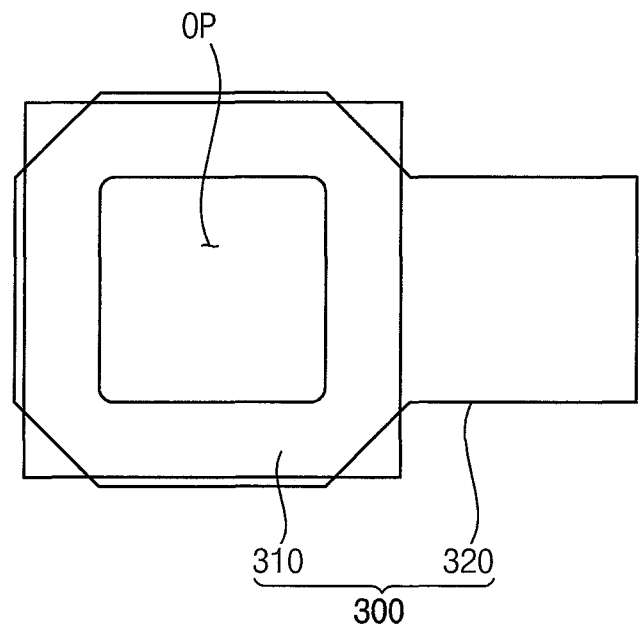
FIGS. 6A and 6B, FIGS. 7A and 7B, FIGS. 8A and 8B, and FIGS. 9A and 9B are plan views and cross-sectional views illustrating a shield-can for explaining a method of manufacturing an electronic apparatus according to an exemplary embodiment of the present inventive concept.
Figure 6B:
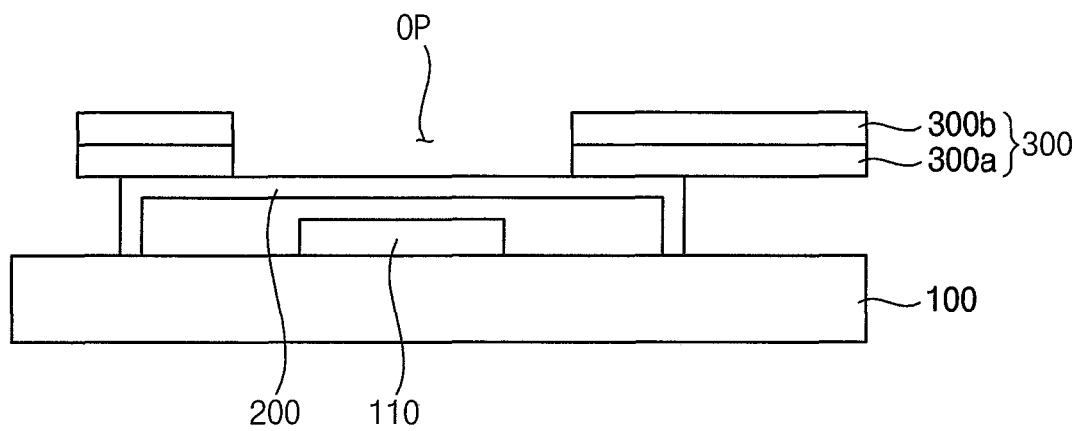

Referring to FIGS. 6A and 6B, a driving chip 110 may be mounted onto a circuit board 100. The shield-can 200, which includes a top surface and a side surface, may be disposed on the circuit board 100, on which the driving chip 110 is mounted. The top surface of the shield-can 200 covers the driving chip 110 and extends parallel to the circuit board 100, and the side surface of the shield-can 200 extends from the top surface in a direction toward the circuit board 100.

A first film 300 having an opening OP that exposes a part of the top surface of the shield-can 200 may be attached to the top surface of the shield-can 200.

The first film 300 may include a body 310, which is configured to cover the top surface of the shield-can 200, and a handle 320 extending from the body 310. At least one corner of the body 310 of the first film 300 may be chamfered, and a corner of the top surface of the shield-can 200 may be exposed at the chamfered corner of the first film 300 without being covered by the first film 300. An edge of the first film 300 may protrude beyond the side surface of the shield-can 200 when viewed in a plan view. The first film 300 may be transparent.

The first film 300 may include an adhesive layer 300a and a film layer 300b. The adhesive layer 300a may be bonded onto the shield-can 200, and the film layer 300b disposed on the adhesive layer 300a.

Figure 7A:
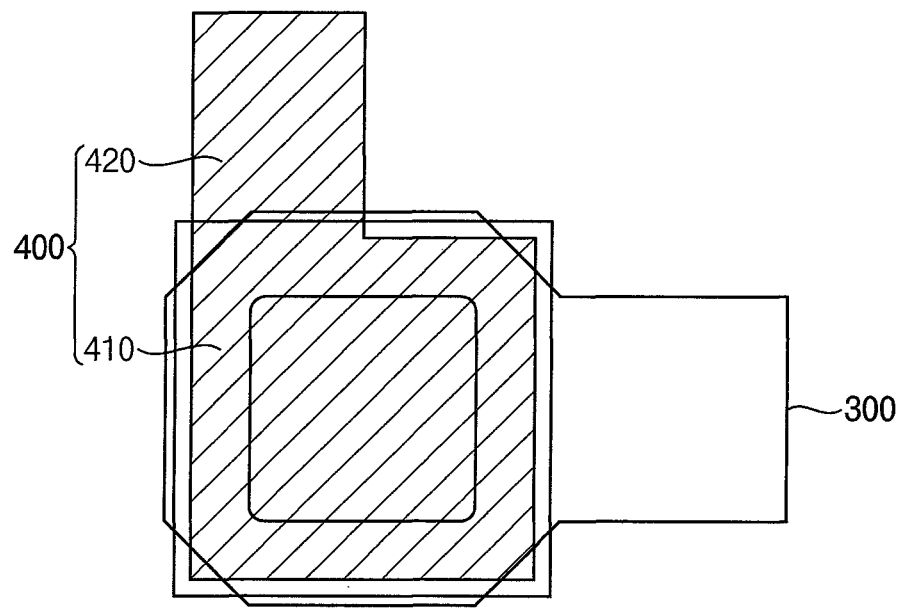
Figure 7B:
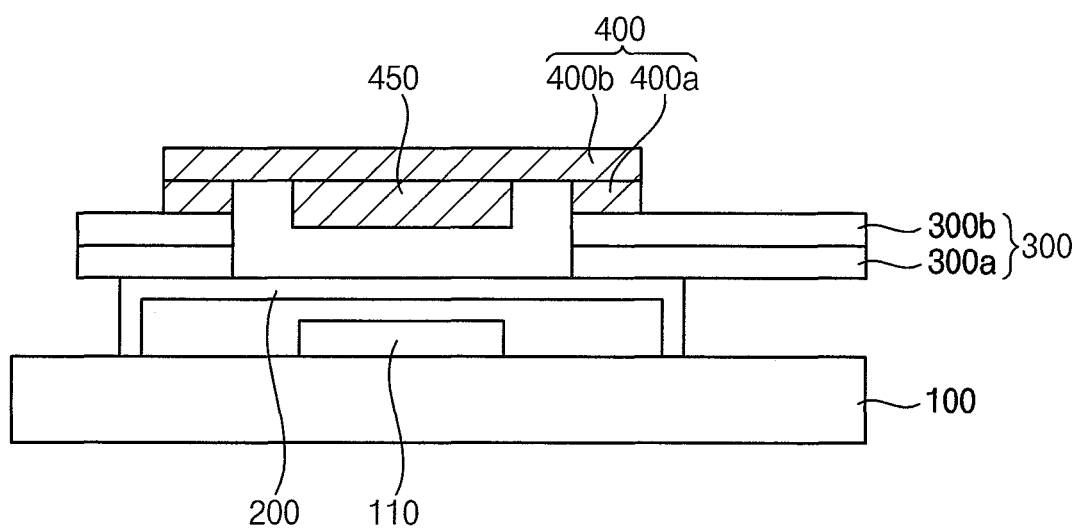

Referring to FIGS. 7A and 7B, a second film 400 may be attached onto the shield-can 200 to which the first film 300 is attached.

The second film 400 may include a body 410 and a handle 420. The body 410 is disposed to overlap the first film 300, and the handle 420 extends from the body 410. For example, the handle 420 may not overlap the first film 300 when viewed in a plan view. The handle 420 of the second film 400 may extend beyond the corner of the top surface of the shield-can 200 that is not covered by the first film 300. In other words, the handle 420 of the second film 400 may be formed closer to a first side of the body 410 than to a second side, opposite to the first side, of the body 410. For example, the handle 420 may not be positioned at a central portion of a side of the body 410.

In an exemplary embodiment of the present inventive concept, the handle 420 of the second film 400 may begin at or after an edge of the first film 300. However, the present inventive concept is not limited thereto, and for example, the handle 420 may overlap the shield-can 200 and the first film 300.

In addition, the second film 400 may be attached to at least one corner of the top surface of the shield-can 200 that is exposed by the first film 300. For example, the handle 420 of the second film 400 may be adjacent to an exposed corner of the top surface of the shield-can 200 and may be attached to the corner of the top surface of the shield-can 200, such that convenience may be facilitated in the step of removing the second film 400 afterward, and the removed state may be easily recognized. When the second film 400 is not removed in a subsequent process, the corner of the top surface of the shield-can 200 may not be exposed by a corner of the body 410 connected to the handle 420 of the second film 400. When the second film 400 is removed, the corner of the top surface of the shield-can 200 may be exposed, and thus the removed state of the second film 400 may be easily detected.

The second film 400 may be transparent.

The second film 400 may include an adhesive layer 400a bonded to the first film 300 and a film layer 400b disposed on the adhesive layer 400a. The adhesive layer 400a may be bonded to the first film 300, and may include, for example, a pressure sensitive adhesive.

The film layer 400b may be disposed on the adhesive layer 400a. The adhesive layer 400a and the film layer 400b may have substantially the same shape when viewed in a plan view. The film layer 400b may include transparent polymer resin such as polyethylene terephthalate (PET).

The second film 400 may further include a filler layer 450 disposed in an area corresponding to the opening of the first film 300 and disposed under the second film layer 400b. For example, the filler layer may be disposed on the film layer 400b of the second film 400.

A filler layer opening may be formed in a portion of the second adhesive layer 400b where the filler layer 450 is disposed, and the filler layer 450 may be disposed in the filler layer opening. A thickness of the filler layer 450 may be greater than a thickness of the second adhesive layer 400b.

Sides of the body 410 of the second film 400 may be disposed inwardly from sides of the body 310 of the second film 300. For example, sides of the body 410 may overlap the shield-can 200 and may not extend beyond edges of the shield-can 200. As an additional example, the width of the body 410 of the second film may be smaller than that of the body 310 of the first film 300. In addition, corners of the body 410 of the second film 400 may be formed outwardly from the chamfered corners of the first film 300. For example, the corners of the body 410 of the second film 400 may extend beyond the chamfered corners of the first film 300. Accordingly, the corners, which are not protected by the first film 300, of the top surface of the shield-can 200 may be protected by the second film 400, and the second film 400 may be easily laminated.

Figure 8A:
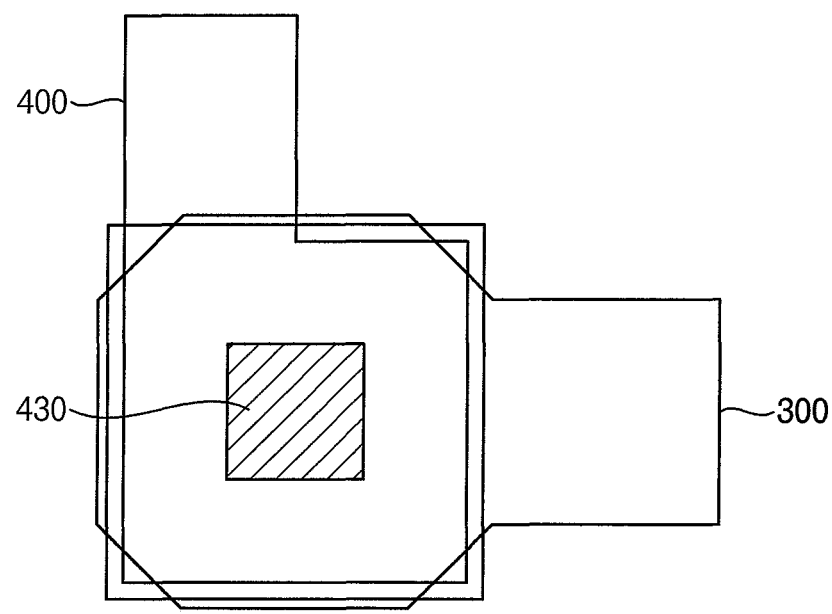
Figure 8B:
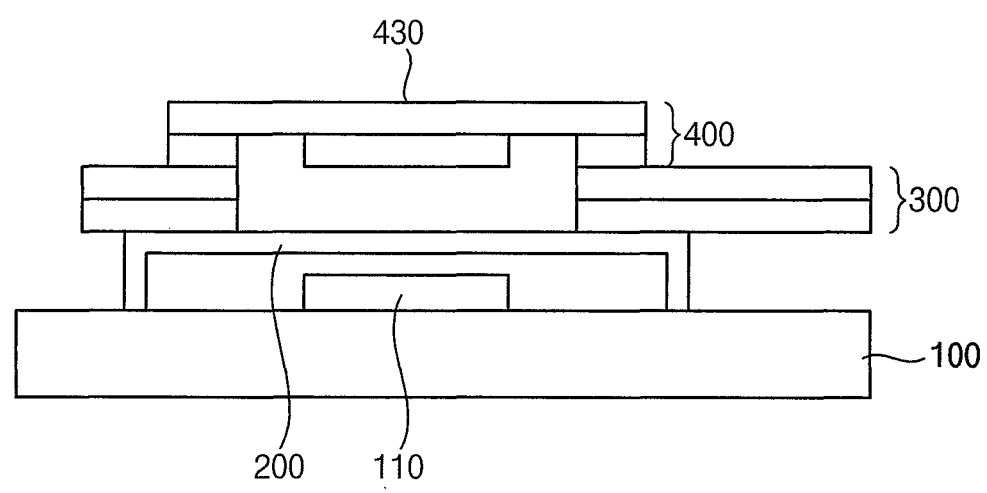

Referring to FIGS. 8A and 8B, an identification mark 430 may be formed on the second film 400. The identification mark 430 may include code and another display of information for inputting module material and process history information that is to be displayed. For example, the identification mark 430 may be a basic identification mark.

A subsequent process such as assembling other components of the electronic apparatus may be performed in a state where the second film 400 is attached to the shield-can 200. Since the shield-can 200 is protected by the first film 300 and the second film 400, the defect, such as the dent occurring on the top surface of the shield-can 200, may be reduced or prevented.

Figure 9A:
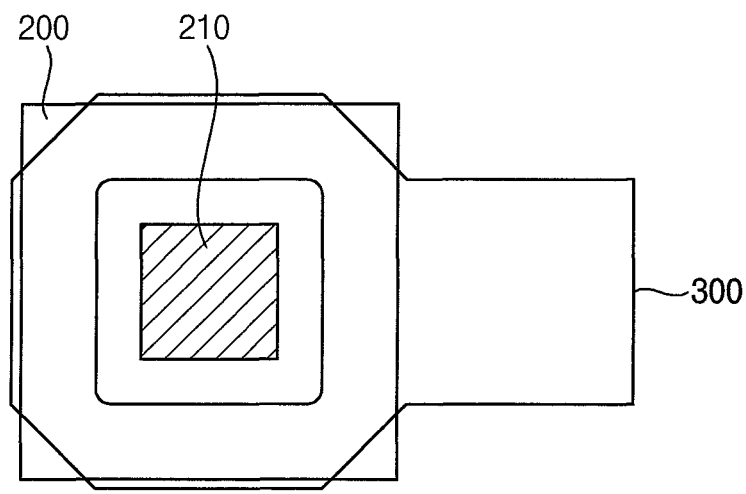
Figure 9B:
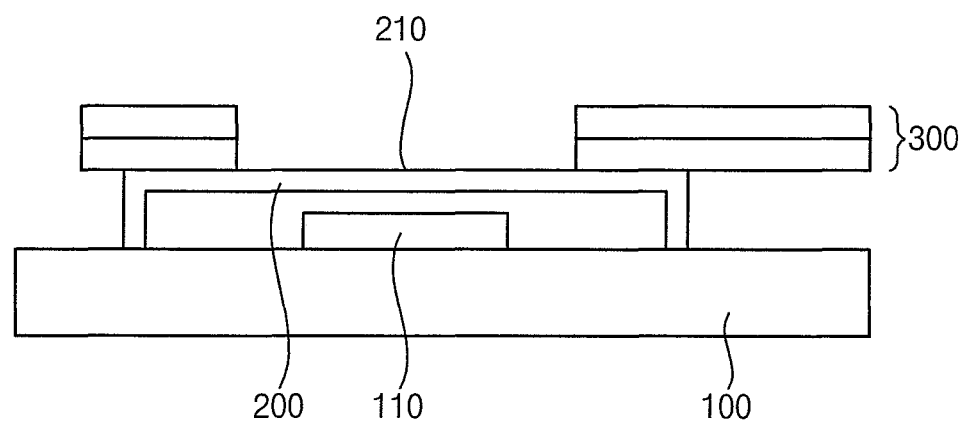

Referring to FIGS. 9A and 9B, the second film 400 may be removed after the identification mark 430 on the second film 400 is detected. The identification mark 210 may be formed on the top surface of the shield-can 200 exposed by the opening OP of the first film 300. For example, the identification mark 210 may be formed by laser-marking the identification mark 210 on the top surface of the shield-can 200. In addition, the identification mark 210 may be formed through a sticker attachment, a printing, or the like.

The exposed corners of the shield-can 200 may be used as alignment marks in the process of forming the identification mark 210 on the top surface of the shield-can 200. In addition, a laminated state of the second film 400 may be checked together.

Then, other assembling processes for manufacturing the electronic apparatus may be performed in a state where the first film 300 is attached. The first film 300 may protect the edge portions of the top surface of the shield-can 200, and the identification mark 210 of the shield-can 200 may be easily checked, so that the occurrence of defect may be prevented without changing the method of manufacturing the electronic apparatus.

Figure 10A:
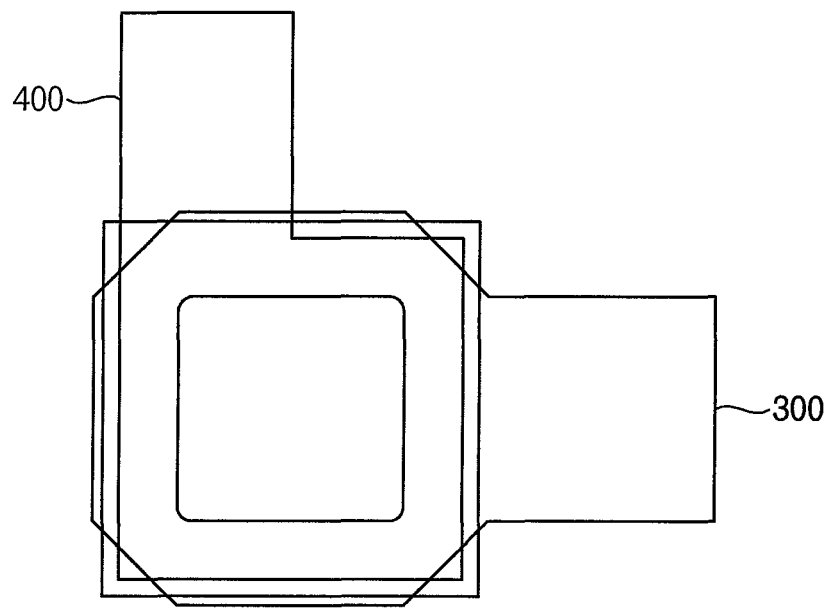
FIGS. 10A and 10B are a plan view and a cross-sectional view, respectively, illustrating a shield-can for explaining a method of manufacturing an electronic apparatus according to an exemplary embodiment of the present inventive concept.
Figure 10B:
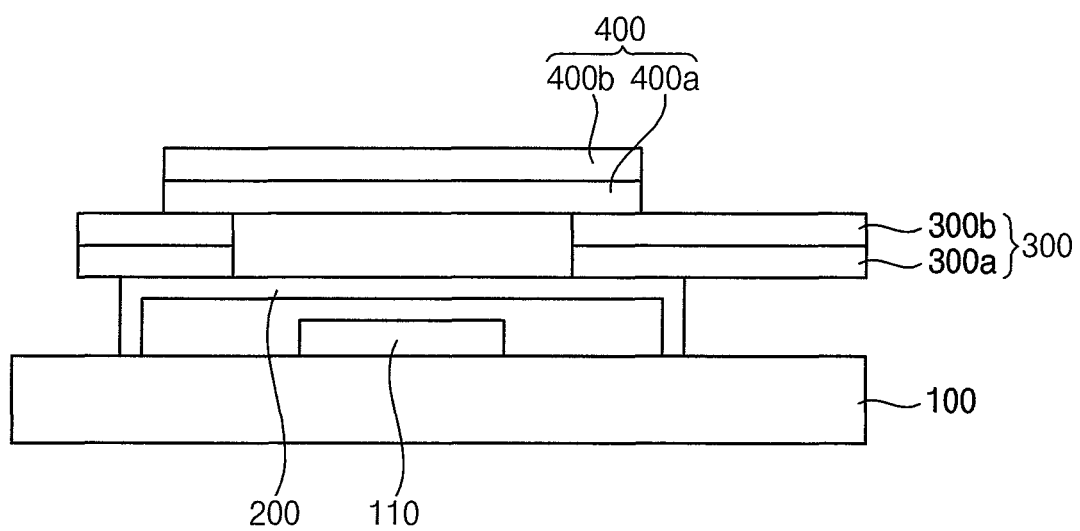

FIGS. 10A and 10B are a plan view and a cross-sectional view, respectively, illustrating a shield-can for explaining a method of manufacturing an electronic apparatus according to an exemplary embodiment of the present inventive concept.

Referring to FIGS. 10A and 10B, the electronic apparatus is substantially the same as the electronic apparatus of FIGS. 8A and 8B except that the second film 400 does not include a filler layer. Accordingly, duplicate descriptions may be omitted.

The electronic apparatus may include a circuit board 100, a driving chip 110, a shield-can 200, a first film 300, and a second film 400. The second film 400 may include an adhesive layer 400a and a film layer 400b. The adhesive layer 400a and the film layer 400b may have substantially the same shape when viewed in a plan view.

In an exemplary embodiment of the present inventive concept, the adhesive layer 400a may be formed with an opening corresponding to the opening of the first film 300 (e.g., the case that the filler layer 450 is excluded according to the embodiment of FIG. 10B).

Figure 11A:
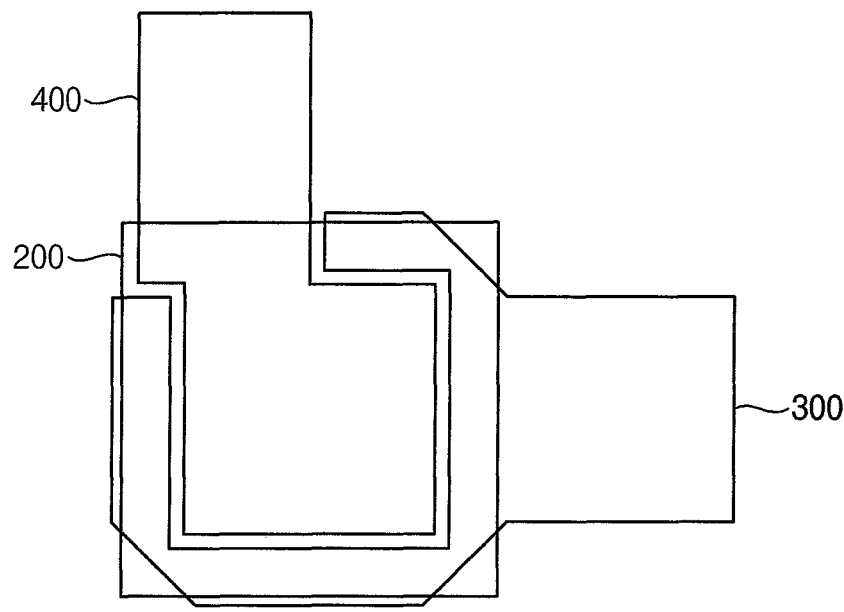
FIGS. 11A and 11B are a plan view and a cross-sectional view, respectively, illustrating a shield-can for explaining a method of manufacturing an electronic apparatus according to an exemplary embodiment of the present inventive concept.
Figure 11B:
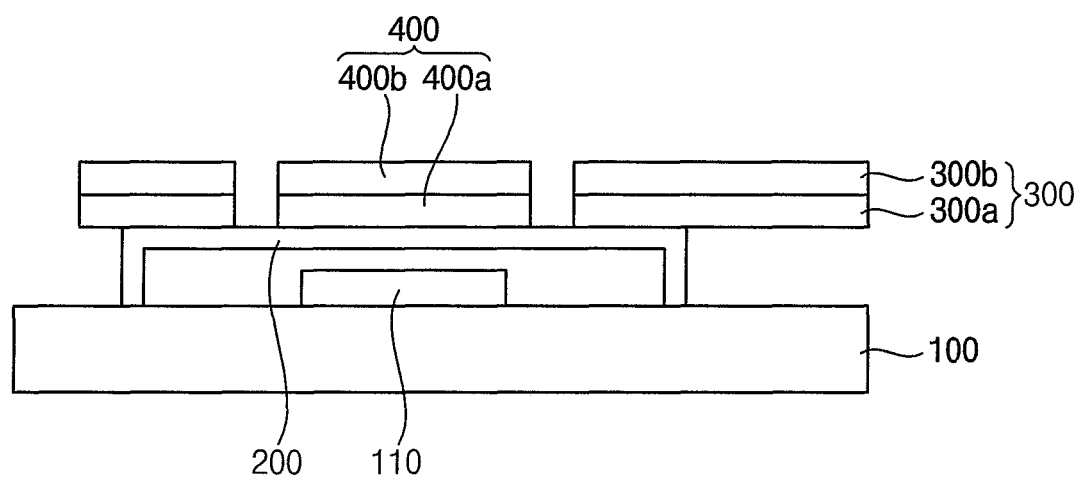

FIGS. 11A and 11B are a plan view and a cross-sectional view, respectively, illustrating a shield-can for explaining a method of manufacturing an electronic apparatus according to an exemplary embodiment of the present inventive concept.

Referring to FIGS. 11A and 11B, the electronic apparatus is substantially the same as the electronic apparatus of FIGS. 8A and 8B except for shapes of the first film 300 and the second film 400. Accordingly, duplicate descriptions may be omitted.

The electronic apparatus may include a circuit board 100, a driving chip 110, a shield-can 200, a first film 300, and a second film 400.

The first film 300 may include an adhesive layer 300a and a film layer 300b. The adhesive layer 300a and the film layer 300b may have substantially the same shape when viewed in a plan view.

The second film 400 may include an adhesive layer 400a and a film layer 400b. The adhesive layer 400a and the film layer 400b may have substantially the same shape when viewed in a plan view.

The opening of the body of the first film 300 may be opened at one side thereof. For example, the body of the first film 300 may include a first opening exposing a top surface of the shield-can 200 and a second opening at a side surface of the body of the first film 300. For example, the body of the first film 300 may form a C-shape when viewed in a plan view. A part of the second film 400 may be attached to the shield-can 200 to be disposed within the opening of the first film 300. For example, the part of the second film 400 may be directly attached to the top surface of the shield-can 200.

Figure 12:
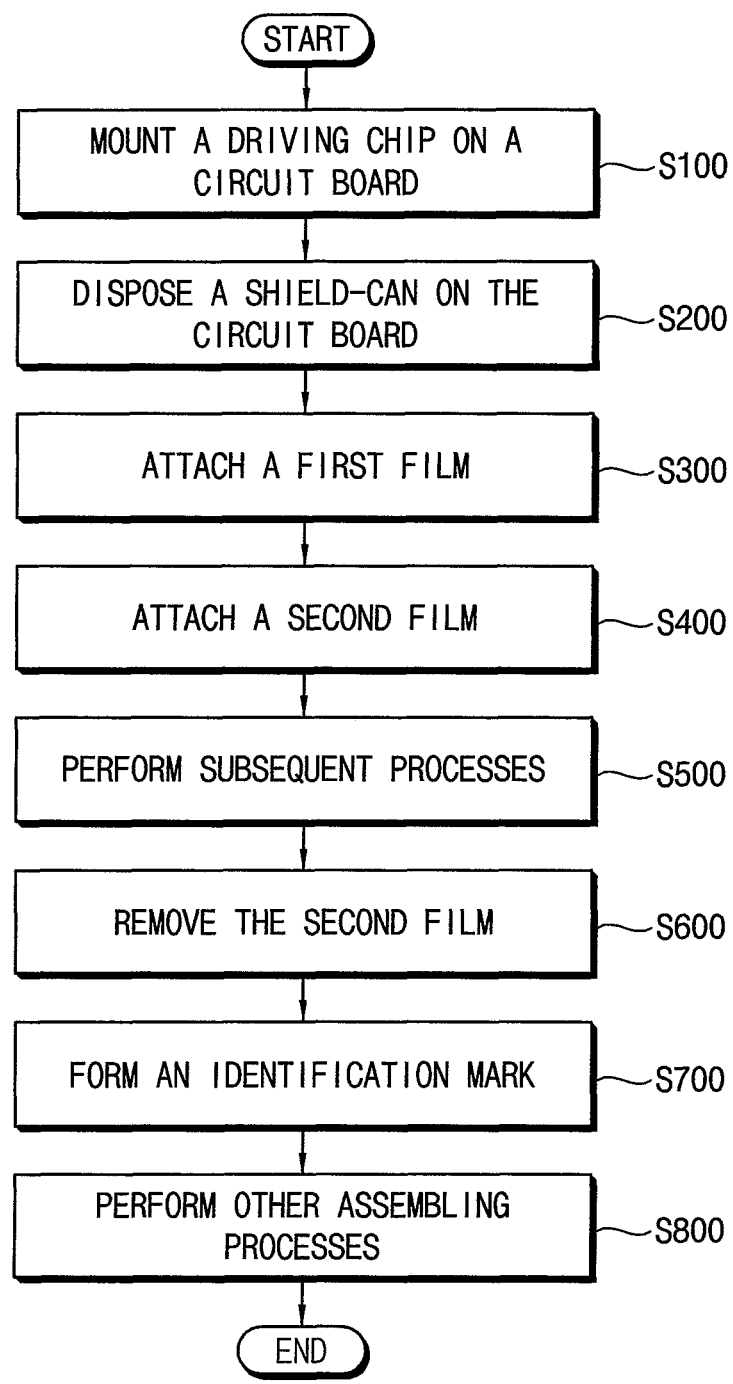
FIG. 12 is a flowchart illustrating a method of manufacturing an electronic apparatus according to an exemplary embodiment of the present inventive concept.

FIG. 12 is a flowchart illustrating a method of manufacturing an electronic apparatus according to an exemplary embodiment of the present inventive concept.

Referring to FIG. 12, the method of manufacturing the electronic apparatus may include: mounting the driving chip on the circuit board (S100); disposing the shield-can on the circuit board (S200); attaching the first film (S300); attaching the second film (S400); performing subsequent processes (S500); removing the second film (S600); forming the identification mark (S700); and performing other assembling processes (S800).

In the step of mounting the driving chip (S100), a driving chip may be mounted on a circuit board.

In the step of disposing the shield-can on the circuit board (S200), the shield-can may be disposed on the circuit board. The shield-can may include a top surface that covers the driving chip and extends parallel to the circuit board, and a side surface extending from the top surface to the circuit board.

In the step of attaching the first film (S300), a first film having an opening that exposes a part of the top surface of the shield-can may be attached onto the top surface of the shield-can.

The first film may include a first adhesive layer and a first film layer. The first adhesive layer may be bonded onto the shield-can, and the first film layer may be disposed on the first adhesive layer. At least one corner of the body of the first film may be chamfered, and thus a corner of the top surface of the shield-can may be exposed without being covered by the first film.

In the step of attaching the second film (S400), a second film may be attached over the shield-can to which the first film is attached.

The second film may include a second adhesive layer and a second film layer. The second adhesive layer may be bonded to the first film layer, and the second film layer may be disposed on the second adhesive layer. The second film may further include a filler layer disposed in an area corresponding to the opening of the first film and disposed under the second film layer. A filler layer opening may be formed in a portion of the second adhesive layer where the filler layer is disposed. The filler layer may be disposed in the filler layer opening, and a thickness of the filler layer may be greater than a thickness of the second adhesive layer. The second film may be attached to cover at least a part of the corner of the top surface of the shield-can that is not covered by the first film.

The second film may include a body and a handle. The body may be disposed to overlap the first film, and the handle may extend from the body without overlapping the first film when viewed in a plan view. The handle may extend from the corner of the top surface of the shield-can that is not covered by the first film.

In an exemplary embodiment of the present inventive concept, the opening of the body of the first film may be opened at one side thereof to form, for example, a C-shape when viewed in a plan view. A part of the second film may be attached on the top surface of the shield-can to be disposed within the opening.

In addition, the manufacturing method may further include forming a basic identification mark on the second film.

In the step of performing subsequent processes (S500), other components of the electronic apparatus may be assembled in a state where the second film is attached onto the shield-can.

In the step of removing the second film (S600), the second film may be removed.

In the step of forming the identification mark (S700), the identification mark may be formed on the top surface of the shield-can exposed by the opening of the first film. The identification mark of the shield-can may be formed using the basic identification mark. For example, identification mark may be formed, through a laser marking, on the portion of the shield-can exposed by the opening of the first film.

In the step of performing other assembling processes (S800), the electronic apparatus may be manufactured by assembling the other components for manufacturing the electronic apparatus.

According to an exemplary embodiment of the present inventive concept, the electronic apparatus may include a circuit board, a driving chip mounted on the circuit board, and a shield-can configured to cover the driving chip. Since the first film is attached to the top surface of the shield-can, the defect such as the dent occurring on the top surface of the shield-can may be reduced or prevented in the subsequent assembly process. The first film may include the body, which is formed with an opening, and the handle.

In addition, since the opening that exposes the identification mark is formed in the first film, the occurrence of defect may be prevented without changing the method of manufacturing the electronic apparatus.

The present inventive concept may be applied to an electronic apparatus including a circuit board and a shield-can. For example, the present inventive concept may be applied to a smart phone, a cellular phone, a video phone, a smart pad, a smart watch, a tablet PC, a car navigation system, a television, a computer monitor, a laptop, a head mounted display (HMD) device, etc.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. An electronic apparatus comprising:
a circuit board;
a driving chip mounted on the circuit board;
a shield-can including a top surface and first and second side surfaces extending in a direction from the top surface to the circuit board, wherein the top surface covers the driving chip; and
a first film disposed on the shield-can and including a first opening that exposes a first part of the top surface of the shield-can,
wherein the first film includes a body and a handle extending from the body, wherein the body includes an edge extending beyond the first side surface of the shield-can, and the handle extends beyond the second side surface of the shield-can,
wherein at least one corner of the body of the first film is chamfered,
wherein a second part of the top surface of the shield-can is exposed by the chamfered corner of the first film.

2. The electronic apparatus of claim 1, wherein the body of the first film covers the shield-can.

3. The electronic apparatus of claim 1, wherein the second part of the top surface of the shield-can is a corner of the top surface of the shield-can.

4. The electronic apparatus of claim 1, wherein an identification mark is formed on the part of the top surface of the shield-can exposed by the opening of the first film.

5. The electronic apparatus of claim 1, wherein the first film is transparent.

6. The electronic apparatus of claim 1, wherein the first film includes a second opening at a side surface of a body of the first film.

7. The electronic apparatus of claim 1, wherein the first film includes an adhesive layer and a film layer disposed on the adhesive layer, wherein the adhesive layer is bonded to the shield-can.

8. The electronic apparatus of claim 1, further comprising:
a second film attached onto the first film.

* * * * *